United States Patent
Ang et al.

(10) Patent No.: US 6,258,677 B1
(45) Date of Patent: Jul. 10, 2001

(54) METHOD OF FABRICATING WEDGE ISOLATION TRANSISTORS

(75) Inventors: Ting Cheong Ang, Singapore (SG); Shyue Fong Quek, Petaling Jaya; Sang Yee Loong, Kuala Lumpur, both of (MY); Jun Song, Singapore (SG)

(73) Assignee: Chartered Seminconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/409,875

(22) Filed: Oct. 1, 1999

(51) Int. Cl.[7] ................................................ H01L 21/336
(52) U.S. Cl. .................... 438/300; 438/199; 438/223; 438/229; 438/231; 438/289; 438/305
(58) Field of Search ....................................... 438/199, 222, 438/223, 226, 229, 231, 286, 299, 300, 301, 303, 305, 306, 595

(56) References Cited

U.S. PATENT DOCUMENTS

| | | | |
|---|---|---|---|
| 5,682,055 | * 10/1997 | Huang et al. | 257/408 |
| 5,773,348 | * 6/1998 | Wu | 438/305 |
| 5,798,278 | * 8/1998 | Chan et al. | 438/300 |
| 5,827,768 | 10/1998 | Lin et al. | 438/300 |
| 5,915,183 | 6/1999 | Gambino et al. | 438/300 |
| 6,110,787 | * 8/2000 | Chan et al. | 438/300 |

* cited by examiner

Primary Examiner—Charles Bowers
Assistant Examiner—Jack Chen
(74) Attorney, Agent, or Firm—George O. Saile; Rosemary L.S. Pike; Stephen S. Stanton

(57) ABSTRACT

A method of fabricating a transistor, comprising the following steps. A silicon semiconductor structure having spaced, raised, wedge-shaped dielectric isolation regions defining an active region there between is provided. Epitaxial silicon is grown over the active area to form an SEG region. A dummy gate is formed over the SEG region. Raised epitaxial silicon layers are grown over the SEG region adjacent the dummy gate. The dummy gate is removed, exposing the interior side walls of the raised epitaxial silicon layers. Sidewall spacers are formed on the exposed sidewalls of the raised epitaxial silicon layers. A gate oxide layer is grown over the SEG region and between the sidewall spacers of the raised epitaxial silicon layers. A layer of polysilicon is deposited over the structure and is planarized to form a gate conductor over the SEG region and between the sidewall spacers of the raised epitaxial silicon layers. The sidewall spacers are removed. No HDP process trench fill is required to form the STIs and no CMP process is required to planarized the STIs.

19 Claims, 3 Drawing Sheets

METHOD OF FABRICATING WEDGE ISOLATION TRANSISTORS

FIELD OF THE INVENTION

The present invention relates generally to methods of forming a transistor device with isolation regions, and specifically to forming wedge field effect transistor (FET) devices with raised source/drains separated by raised isolation regions.

BACKGROUND OF THE INVENTION

As transistor manufacturing delves into the sub micron and deep submicron range (less than 0.25 microns), the short channel length of the transistors so formed causes an effect named, appropriately enough, the short channel effect. Raised source/drain junctions can provide shallow junctions with low series resistance and that reduce the short channel effect. Raised isolation regions increase the electrical isolation between adjacent transistors and, for example, reduces undesired leakage current.

U.S. Pat. No. 5,915,183 to Gambino et al. describes a process for forming raised source/drain junctions using chemical-mechanical polishing (CMP) combined with a recess etch of blanket polysilicon. The raised source/drains are defined by salicide gate conductors and raised shallow isolation trench regions (STI).

U.S. Pat. No. 5,682,055 to Huang et al. describes a method of forming an improved planar structure of a semiconductor integrated circuit, and an integrated circuit formed therefrom.

U.S. Pat. No. 5,827,768 to Lin et al. describes a method of manufacturing a MOS (metal-oxide-semiconductor) transistor applied in the deep micron process. A polysilicon layer is mainly used to form a raised source/drain structure and self-alignment is achieved by means of a planarization process.

SUMMARY OF THE INVENTION

Accordingly, it is an object of the present invention to provide a method of forming transistors separated by wedge shaped raised isolation regions that increases electrical isolation between the transistors.

Another object of the present invention is to provide a method of forming transistors having raised source/drains separated by wedge shaped raised isolation regions that increases electrical isolation between the transistors.

A further object of the present invention is to provide a method of forming wedge shaped or re-entrant shallow trench isolation (STI) regions.

Yet a further object of the present invention is to provide a method of forming shallow trench isolation (STI) regions without the use of high density plasma (HDP) oxide fill and chemical-mechanical polishing (CMP) processes.

Other objects will appear hereinafter.

It has now been discovered that the above and other objects of the present invention may be accomplished in the following manner. Specifically, a silicon semiconductor structure having spaced, raised dielectric isolation regions defining an active region there between is provided. Epitaxial silicon is grown over the active area to form an SEG region. A dummy gate is formed over the SEG region. Raised epitaxial silicon layers are grown over the SEG region adjacent the dummy gate. The dummy gate is removed, exposing the interior side walls of the raised epitaxial silicon layers. Sidewall spacers are formed on the exposed sidewalls of the raised epitaxial silicon layers. A gate oxide layer is grown over the SEG region and between the sidewall spacers of the raised epitaxial silicon layers. A layer of polysilicon is deposited over the structure and is planarized to form a gate conductor over the SEG region and between the sidewall spacers of the raised epitaxial silicon layers. The sidewall spacers are removed.

BRIEF DESCRIPTION OF THE DRAWINGS

The features and advantages of the method of fabricating a wedge isolation FET transistor device according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Figure 1:
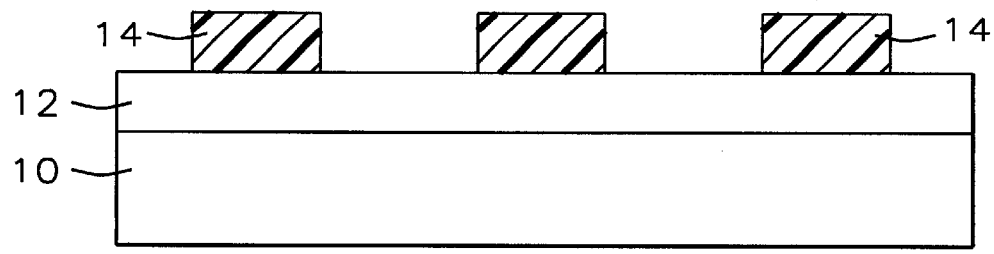
FIGS. 1 through 11 schematically illustrate in cross-sectional representation a preferred embodiment of the present invention.

Accordingly as shown in FIG. 1, silicon semiconductor substrate 10 includes a upper surface of silicon. Dielectric layer 12 is deposited over silicon semiconductor substrate 10 to a thickness of from about 500 to 10,000 Å, and more preferably from about 1500 to 4000 Å. Dielectric layer 12 may be comprised of any insulator, for example silicon oxide ($SiO_2$), silicon oxynitride (SiON), or silicon nitride ($Si_xN_y$). Photoresist layer 14 is deposited and patterned over dielectric layer 12 as shown.

Figure 2:
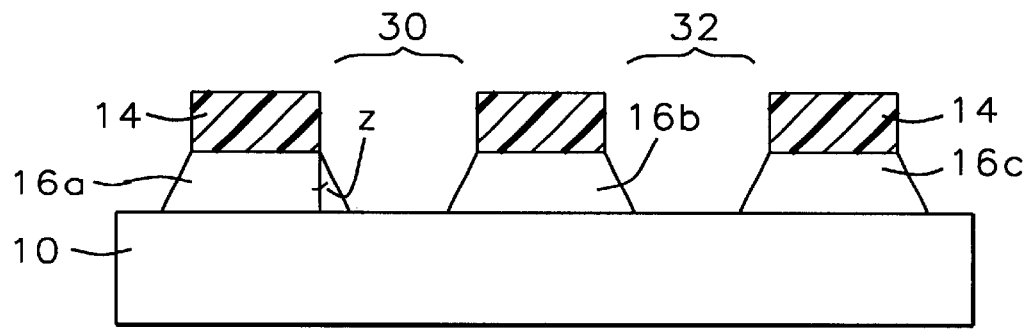
Figure 3:
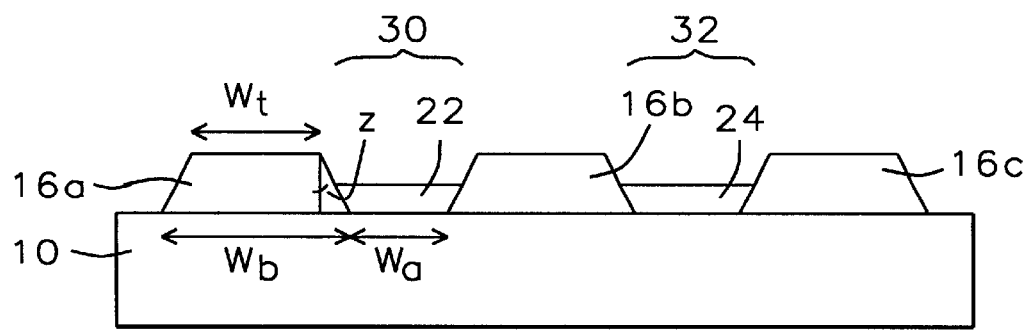

As shown in FIGS. 2 and 3, dielectric layer 12 is etched to form raised isolation regions 16a, 16b, 16c separated by active regions 30, 32 having a base width $w_a$ of from about 1000 to 100,000 Å. That is, for example, isolation regions 16a, 16b are separated by NMOS active region 30 and isolation regions 16b, 16c are separated by PMOS active region 32. Each isolation region 16a, 16b, 16c are preferably wedge shaped having an angle Z from about 3 to 50°, with a base width $w_b$ of from about 5000 to 100,000 Å and a top width wt of from about 100 to 80,000 Å.

Note that for purposes of example, dielectric layer 12 is patterned and etched to form three raised isolation regions 16a, 16b, 16c which permits the following illustration of forming a PMOS transistor and an adjacent NMOS transistor. It is appreciated that two like transistors may be formed and if only one such transistor is desired, only two raised isolation regions separated by an active region may be formed.

As shown in FIG. 3, pattered photoresist layer 14 is stripped and removed from isolation regions 16a, 16b, 16c. Epitaxial silicon is selectively grown over silicon semiconductor substrate within active regions 30, 32 to form NMOS SEG (selective epitaxial growth) region 22 and PMOS SEG region 24, respectively.

Figure 4:
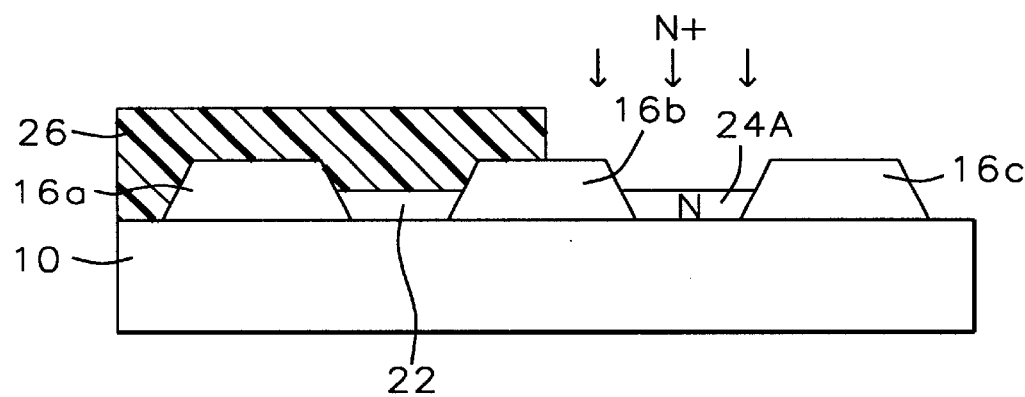

As shown in FIG. 4, a photo resist layer is deposited and patterned to form PMOS N+ photoresist mask 26 over at least NMOS SEG region 22 within NMOS active area 30. N+ ions, P or As, are implanted into PMOS SEG region 24 to form N-doped PMOS well region 24A.

Figure 5:
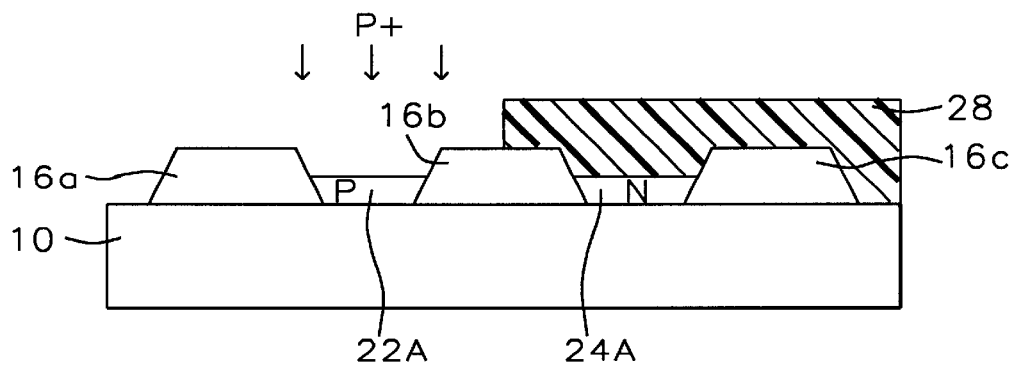

As shown in FIG. 5, PMOS N+ photoresist mask 26 is stripped and removed and another photo resist layer is deposited and patterned to form NMOS P+ photoresist mask 28 over at least N-doped PMOS well region 24A within PMOS active area 32. P+ ions, for example B, are implanted into NMOS SEG region 22 to form P-doped NMOS well region 22A.

Of course the steps of FIGS. 4 and 5 could be reversed and NMOS well region 22A could be doped first. Further if the adjacent transistors are to be the same, e.g. two adjacent PMOS transistors or two adjacent NMOS transistors, photoresist masking layers 26, 28 would not be necessary and both well regions could be ion implanted at the same time with either N-type or P-type ions.

Figure 6:
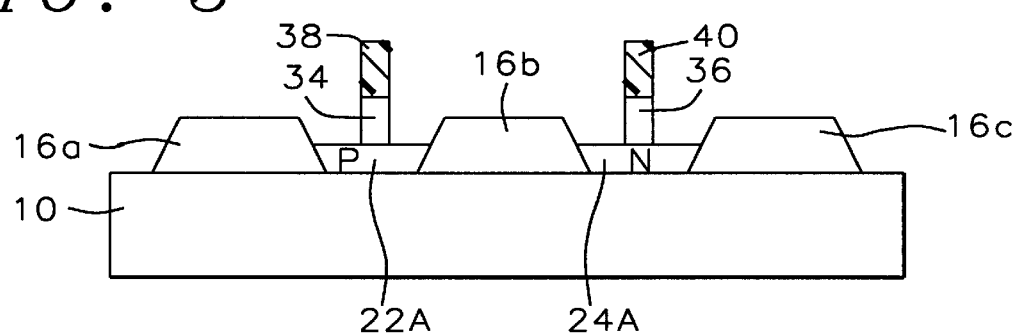

As shown in FIG. 6, NMOS P+ photoresist mask 28 is stripped and removed and dummy gates 34, 36 are formed over NMOS well region 22A, PMOS well region 24A, respectively, as follows. A dielectric layer, comprised preferably of silicon oxide or silicon nitride, is deposited over the structure. A patterned photoresist layer is formed over the dielectric layer and the dielectric layer is etched to form dummy gates 34, 36 with overlying patterned photoresist portions 38, 40, respectively.

Figure 7:
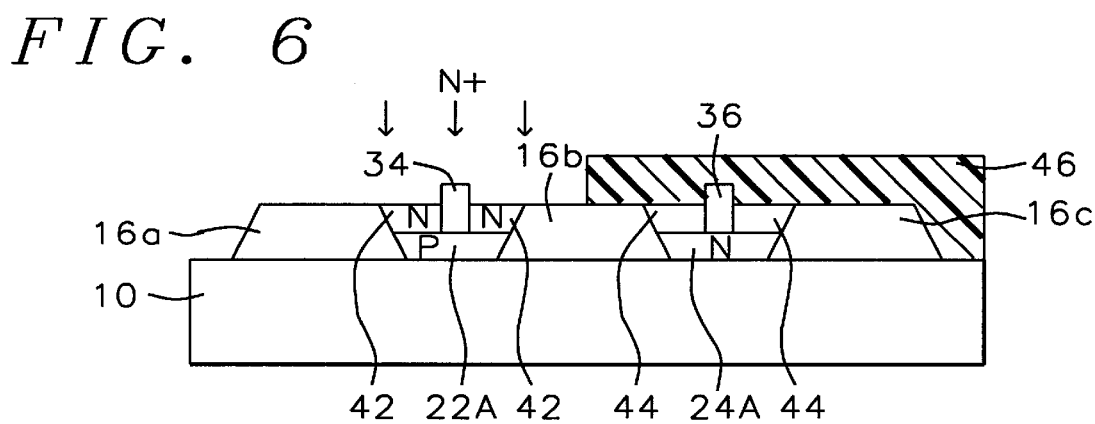

As shown in FIG. 7, overlying patterned photoresist portions 38, 40 are stripped and removed from dummy gates 34, 36, respectively. Raised epitaxial silicon layers 42, 44 are selectively deposited over NMOS well region 22A and PMOS well region 24A, respectively, and adjacent to dummy gates 34, 36, respectively. Raised epitaxial silicon layers 42, 44 preferably have a height equal to the height of the respective adjacent raised isolation regions 16a, 16b, 16c.

Another photo resist layer is deposited and patterned to form NMOS N+ source/drain (S/D) mask 46 over at least PMOS raised epitaxial silicon layers 44 within PMOS active area 32. N+ ions, P or As, are implanted into raised NMOS epitaxial silicon layers 42 to form N-doped NMOS raised S/D 42A.

Figure 8:
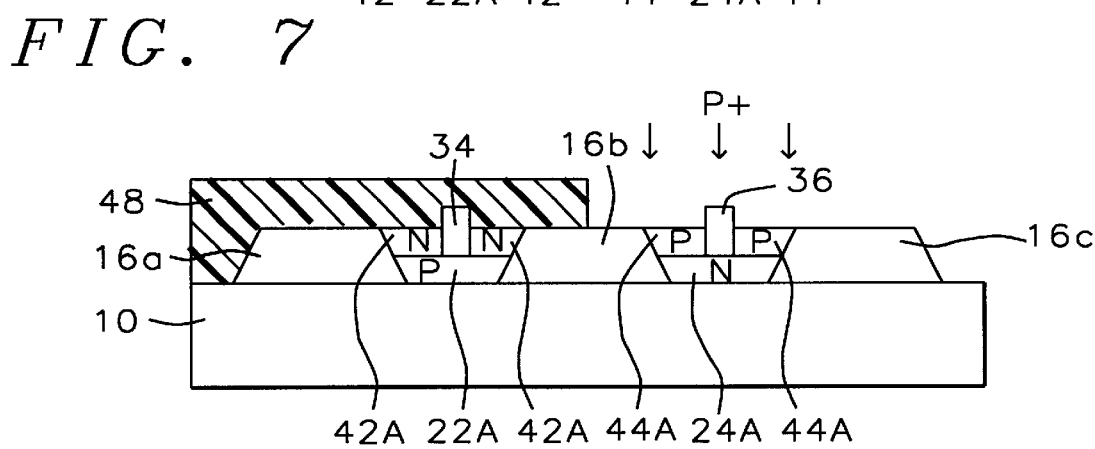

As shown in FIG. 8, NMOS N+ source/drain (S/D) mask 46 is stripped and removed and another photo resist layer is deposited and patterned to form PMOS P+ source/drain (S/D) mask 48 over at least N-doped NMOS raised S/D 42A within NMOS active area 30. P+ ions, B, are implanted into raised PMOS epitaxial silicon layers 44 to form P-doped PMOS raised S/D 44A.

Of course the immediately preceding steps illustrated in FIGS. 7 and 8 could be reversed and P-doped PMOS raised S/D 44A could be doped first. Further if the adjacent transistors are to be the same, e.g. a adjacent PMOS transistors or two adjacent NMOS transistors, photoresist masking layers 46, 48 would not be necessary and both raised S/Ds could be ion implanted at the same time with the same type ions.

Figure 9:
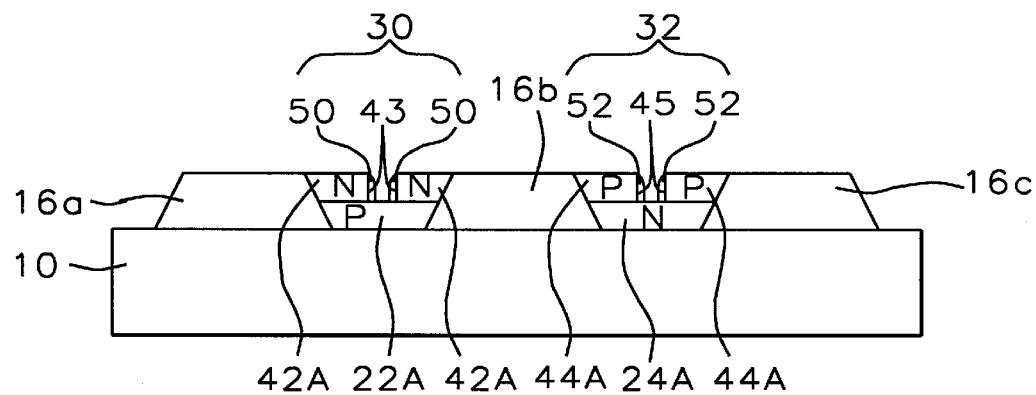

As shown in FIG. 9, PMOS P+ source/drain (S/D) mask 48 is stripped and removed. Dummy gates 34, 36 are then stripped and removed, exposing the respective facing interior side walls 43, 45 of NMOS raised S/D 42A and PMOS raised S/D 44A. A dielectric layer is deposited over NMOS raised S/D 42A and PMOS raised S/D 44A and etched to form NMOS raised S/D sidewall spacers 50 and PMOS raised S/D sidewall spacers 52. Sidewall spacers 50, 52 may be comprised of any semiconductor dielectric material, such as, for example, $SiO_2$, SiON, or SiN.

Figure 10:
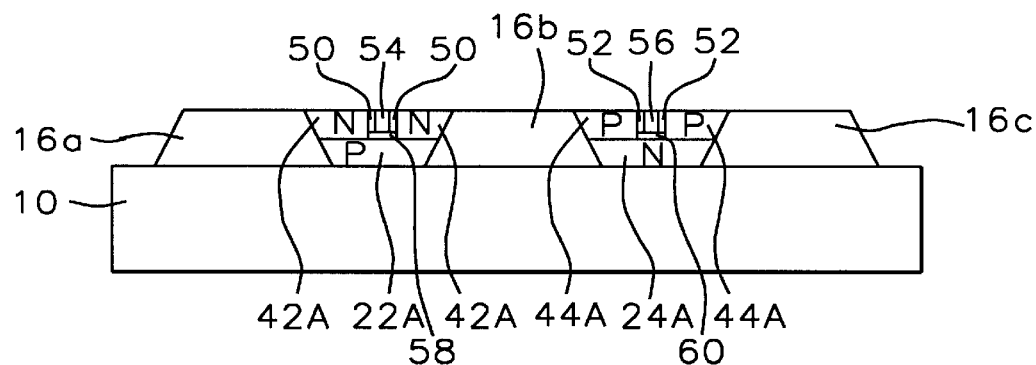

As shown in FIG. 10, gate oxide layers 58, 60 are grown over NMOS well region 22A and PMOS well region 24A and between NMOS and PMOS sidewall spacers 50, 52, respectively. Gate oxide layers 58, 60 are from about 15 to 20 nm thick.

A polysilicon layer is then deposited over gate oxide layers 58, 60 and is planarized by chemical-mechanical polishing (CMP) to form NMOS and PMOS gate conductors 54, 56 between NMOS and PMOS sidewall spacers 50, 52, respectively. Gate conductors 54, 56 are preferably doped in situ during deposition of the polysilicon layer.

Figure 11:
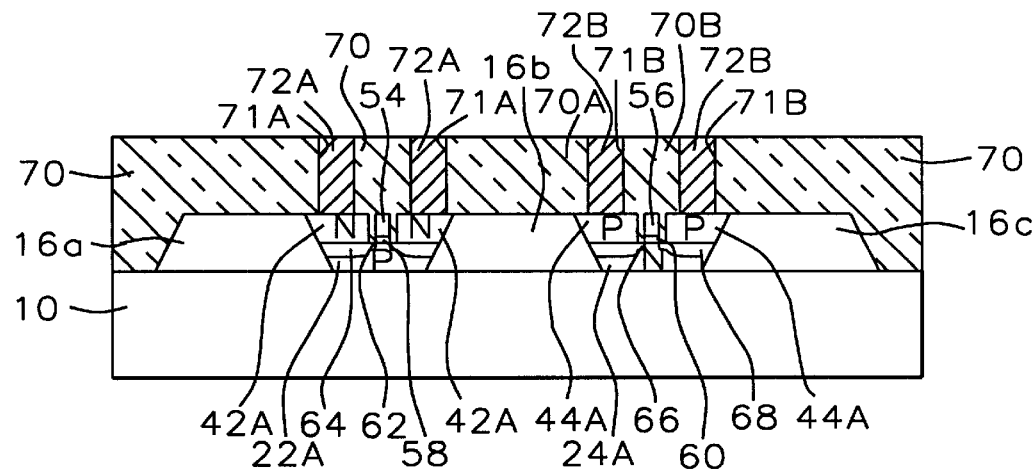

As shown in FIG. 11, NMOS and PMOS sidewall spacers 50, 52 are removed, again exposing respective facing interior side walls 43, 45 of NMOS raised S/D 42A and PMOS raised S/D 44A.

NMOS and PMOS source/drain extension implants 62, 64; and 66, 68, respectively, are then formed in NMOS and PMOS well region 22A, 24A, respectively. NMOS and PMOS source/drain extensions are comprised of low doped drains (LDD) 62, 66, and heavy doped drains (HDD) 64, 68, respectively thus forming completing the formation of adjacent PMOS and NMOS wedge isolation FET transistors. Ions are implanted in the space where the NMOS and PMOS sidewall spacers 50, 52, respectively, were before removal.

An interlevel dielectric layer (ILD) 70 can be deposited over the structure and then patterned and etched to form contact holes 71A, 71B exposing NMOS and PMOS raised S/D 42A, 44A, respectively. Metal, for example tungsten (W) or copper (Cu), can then be deposited in contact holes 71 and planarized, by CMP for example, to form contacts 72A, 72B contacting the sources and drains of NMOS and PMOS raised S/D 42A, 44A, respectively.

The wedge isolation regions 16a, 16b, 16c provide better isolation that conventional STIs because the architecture produces a raised device architecture with a shallow source/drain junction which is located at the enclosed region and in addition, it provides a smaller surface foot print and increased pattern density.

Dishing caused by chemical-mechanical polishing (CMP) in conventional shallow trench isolation (STI) regions is eliminated from the present invention because CMP is not necessary to form wedge shaped STIs 16a, 16b, 16c. A high density plasma (HDP) process is also not required to form the wedge isolation transistors of the present invention.

Further, no gap filling issues are faced in the present invention because the gap fill step for the trench for STIs 16a, 16b, 16c is not required. The trenches in the present invention are for transistors and not for STIs.

While particular embodiments of the present invention have been illustrated and described, it is not intended to limit the invention, except as defined by the following claims.

We claim:

1. A method of fabricating a transistor, comprising the steps of:

providing a silicon semiconductor structure having spaced, raised dielectric isolation regions defining an active region there between;

selectively growing epitaxial silicon over said active region to form an SEG region;

forming a dummy gate over said SEG region;

selectively growing raised epitaxial silicon layers over said SEG region adjacent said dummy gate;

removing said dummy gate to expose interior side walls of said raised epitaxial silicon layers;

forming sidewall spacers on said exposed interior side walls of said raised epitaxial silicon layers;

growing a gate oxide layer over said SEG region and between said sidewall spacers of said raised epitaxial silicon layers;

depositing a polysilicon layer over the silicon semiconductor structure;

planarizing said polysilicon layer to form a gate conductor over said SEG region and between said sidewall spacers of said raised epitaxial silicon layers; and removing said sidewall spacers.

2. The method of claim 1, further including the steps of:

doping said SEG region with a first type of ion to form a doped well;

doping said raised epitaxial silicon layers with a second type of ion to form raised source/drain regions; and forming source/drain extension implants in said doped well doped with said second type of ion.

3. The method of claim 1, further including the steps of:

forming a dielectric layer over the silicon semiconductor structure;

etching said dielectric layer to form contact holes exposing said raised epitaxial silicon layers; and depositing and planarizing a metal within said contact holes to form contacts with said raised epitaxial silicon layers.

4. The method of claim 1, wherein said raised dielectric isolation regions are wedge shaped at an angle of from about 3 to 50°.

5. The method of claim 1, wherein:

said raised dielectric isolation regions have a base width of from about 5000 to 100,000 Å and a top width of from about 100 to 80,000 Å.

6. The method of claim 1, wherein said active region between said raised dielectric isolation regions has a base width from about 100 to 100,000 nm.

7. The method of claim 1, further including the steps of:

doping said SEG region with a P-type ion to form a doped well;

doping said raised epitaxial silicon layers with an N-type of ion to form raised source/drain regions; and forming source/drain extension implants in said doped well doped with said N-type of ion.

8. The method of claim 1, further including the steps of:

doping said SEG region with a N-type ion to form a doped well;

doping said raised epitaxial silicon layers with an P-type of ion to form raised source/drain regions; and forming source/drain extension implants in said doped well doped with said P-type of ion.

9. The method of claim 1, further including the steps of:

forming a dielectric layer over the silicon semiconductor structure;

etching said dielectric layer to form contact holes exposing said raised epitaxial silicon layers; and depositing and planarizing a metal within said contact holes to form contacts with said raised epitaxial silicon layers;

wherein said raised dielectric isolation regions are wedge shaped at an angle of from about 3 to 50°.

10. A method of fabricating a transistor, comprising the steps of:

providing a silicon semiconductor structure having spaced, raised dielectric isolation regions defining an active region there between;

selectively growing epitaxial silicon over said active region to form an SEG region;

doping said SEG region to form a doped well;

forming a dummy gate over said doped well;

selectively growing raised epitaxial silicon layers over said doped well adjacent said dummy gate;

doping said raised epitaxial silicon layers to form raised doped source/drain regions;

removing said dummy gate to expose interior side walls of said raised doped source/drain regions;

forming sidewall spacers on said exposed interior side walls of said raised doped source/ drain regions;

growing a gate oxide layer over said doped well and between said sidewall spacers of said raised doped source/drain regions;

depositing a polysilicon layer over the silicon semiconductor structure;

planarizing said polysilicon layer to form a gate conductor over said doped well and between said sidewall spacers of said raised doped source/drain regions;

removing said sidewall spacers; and forming source/drain extension implants in said doped well.

11. The method of claim 10, further including the steps of:

forming a dielectric layer over the silicon semiconductor structure;

etching said dielectric layer to form contact holes exposing said raised doped source/drain regions; and depositing and planarizing a metal within said contact holes to form contacts with said raised doped source/ drain regions.

12. The method of claim 10, wherein:

said raised dielectric isolation regions have a base width of from about 5000 to 100,000 Å and a top width of from about 100 to 80,000 Å.

13. The method of claim 10, further including the steps of:

forming a dielectric layer over the silicon semiconductor structure;

etching said dielectric layer to form contact holes exposing said raised doped source/drain regions; and depositing and planarizing a metal within said contact holes to form contacts with said raised doped source/ drain regions;

wherein said raised dielectric isolation regions are wedge shaped at an angle of from about 3 to 50°.

14. The method of claim 10, wherein:

said doped well is doped with a first type of ions;

said raised doped source/drain regions are doped with a second type of ions; and said source/drain extension implants are doped with said second type of ions.

15. The method of claim 10, wherein:

said doped well is doped with a P-type ions;

said raised doped source/drain regions are doped with a N-type ions; and said source/drain extension implants are doped with said N-type ions.

16. The method of claim 10, wherein:

said doped well is doped with a N-type ions;

said raised doped source/drain regions are doped with a P-type ions; and said source/drain extension implants are doped with said P-type ions.

17. A method of fabricating wedge isolation transistors, comprising the steps of:

providing a silicon semiconductor structure having a first dielectric layer hereon;

depositing and patterning a photoresist layer over said first dielectric layer;

etching said first dielectric layer to form three raised isolation regions defining two active regions between adjacent said isolation regions raised; said isolation regions raised having sidewalls extending from uppermost silicon semiconductor structure at an angle from about 3 to 50°, removing said patterned photoresist layer;

selectively growing epitaxial silicon over said active regions to form SEG regions;

depositing and patterning a first photoresist N-type mask layer over one of said SEG regions defining a NMOS area under said first photoresist N-type mask layer and an exposed PMOS area not under said first photoresist N-type, mask layer;

implanting N-type ions in said PMOS area SEG well region to form an N-type removing said first photoresist N-type mask layer;

depositing and patterning a first photoresist P-type mask layer over said PMOS area;

implanting P-type ions in said NMOS area SEG region to form an P-type well;

removing said first photoresist P-type mask layer;

forming dummy gates over said NMOS P-type well and PMOS N-type well;

selectively growing epitaxial silicon over an unmasked NMOS P-type well and PMOS N-type well, to a height equal to the height of said isolation regions, to form raised NMOS source/drain regions over said NMOS P-type well and raised PMOS source/drain regions over said PMOS N-type well;

depositing and patterning a second photoresist N-type mask layer over said PMOS area;

implanting N-type ions in said raised NMOS source/drain regions;

removing said second photoresist N-type mask layer;

depositing and patterning a second photoresist P-type mask layer over said NMOS area;

implanting P-type ions in said raised PMOS source/drain regions;

removing said second photoresist P-type mask layer;

removing said dummy gates from said NMOS P-type well and PMOS N-type well leaving a NMOS gate opening over said NMOS P-type well and a PMOS gate opening over said PMOS N-type well;

selectively depositing dielectric spacer layers over said NMOS P-type well and said PMOS N-type well, filling said NMOS gate opening and said PMOS gate opening;

etching said dielectric spacer layers to form NMOS and PMOS spacers adjacent said raised NMOS and raised PMOS source/drain regions;

growing a gate oxide layer over NMOS P-type and PMOS N-type wells between said NMOS and PMOS spacers;

depositing a polysilicon layer over the silicon semi conductor structure, filling NMOS gate opening and PMOS gate opening;

planarizing said polysilicon layer level with the height of said raised NMOS and PMOS source/drain regions;

removing said NMOS and PMOS spacers;

implanting source/drain extensions within said NMOS P-type and PMOS N-type wells forming respective low doped and heavy doped regions;

depositing and patterning a dielectric contact layer over said silicon semiconductor structure to form contact holes exposing said raised NMOS and PMOS source/drain regions; and depositing and planarizing metal in said contact holes to form metal contacts.

18. The method of claim 17, wherein said P-type ions are boron ions and said N-type ions are selected from the group comprising arsenic ions and phosphorus ions.

19. A method of fabricating a transistor, comprising the steps of:

providing a silicon semiconductor structure having spaced, raised, wedge-shaped dielectric isolation regions defining an active region there between;

selectively growing epitaxial silicon over said active region to form an SEG region;

forming a dummy gate over said SEG region;

selectively growing raised epitaxial silicon layers over said SEG region adjacent said dummy gate;

removing said dummy gate to expose interior side walls of said raised epitaxial silicon layers;

forming sidewall spacers on said exposed interior side walls of said raised epitaxial silicon layers;

growing a gate oxide layer over said SEG region and between said sidewall spacers of said raised epitaxial silicon layers;

depositing a polysilicon layer over the silicon semiconductor structure;

planarizing said polysilicon layer to form a gate conductor over said SEG region and between said sidewall spacers of said raised epitaxial silicon layers; and removing said sidewall spacers;

whereby the transistor is fabricated without the use of a high density plasma process or a chemical-mechanical polishing process.

* * * * *